US008418221B1

(12) United States Patent
Young et al.

(10) Patent No.: US 8,418,221 B1
(45) Date of Patent: Apr. 9, 2013

(54) METHODS OF PRIORITIZING ROUTING RESOURCES TO GENERATE AND EVALUATE TEST DESIGNS IN PROGRAMMABLE LOGIC DEVICES

(75) Inventors: Jay T. Young, Louisville, CO (US); Ian L. McEwen, Golden, CO (US)

(73) Assignee: Xilinx, Inc., San Jose, CA (US)

( * ) Notice: Subject to any disclaimer, the term of this patent is extended or adjusted under 35 U.S.C. 154(b) by 2941 days.

(21) Appl. No.: 10/777,421

(22) Filed: Feb. 12, 2004

Related U.S. Application Data

(63) Continuation-in-part of application No. 10/696,357, filed on Oct. 28, 2003, now Pat. No. 7,058,919.

(51) Int. Cl.
*G06F 21/00* (2006.01)

(52) U.S. Cl.
USPC .......... 726/1

(58) Field of Classification Search ...... 726/1; 709/238, 709/240; 380/59; 326/16, 37–39, 41, 47, 326/136; 324/73.1, 500, 508, 509, 512, 519–525, 324/527, 528, 531, 532, 535, 537, 538, 555, 324/750, 754, 765; 714/724–745; 716/1, 716/4, 12, 16
See application file for complete search history.

(56) References Cited

U.S. PATENT DOCUMENTS 5,027,353 A * 6/1991 Jarwala et al. .......... 714/738
5,414,716 A * 5/1995 Bershteyn .......... 714/738
5,648,913 A * 7/1997 Bennett et al. .......... 716/6
5,701,441 A * 12/1997 Trimberger .......... 716/16
5,761,484 A 6/1998 Agarwal et al.
5,854,899 A * 12/1998 Callon et al. .......... 709/238
5,867,507 A 2/1999 Beebe et al.
6,086,629 A 7/2000 McGettigan et al.
6,107,821 A * 8/2000 Kelem et al. .......... 326/38
6,130,554 A 10/2000 Kolze et al.
6,185,724 B1 2/2001 Ochotta
6,216,258 B1 * 4/2001 Mohan et al. .......... 716/17
6,243,851 B1 * 6/2001 Hwang et al. .......... 716/10
6,311,316 B1 * 10/2001 Huggins et al. .......... 716/12
6,407,576 B1 * 6/2002 Ngai et al. .......... 326/41
6,501,297 B1 12/2002 Kong
6,526,558 B2 2/2003 Agrawal et al.
6,851,101 B1 2/2005 Kong et al.
7,096,263 B2 * 8/2006 Leighton et al. .......... 709/224

OTHER PUBLICATIONS

U.S. Appl. No. 10/231,900, filed Aug. 29, 2002, Sun et al.

* cited by examiner

*Primary Examiner* — Oscar Louie
(74) *Attorney, Agent, or Firm* — Lois D. Cartier; LeRoy D. Maunu

(57) ABSTRACT

Methods of prioritizing untested routing resources in programmable logic devices (PLDs) to generate test suites that include a minimal number of test designs. The untested routing resources are prioritized (e.g., placed into an ordered list) based on a number of untested input or output terminals for each untested resource. The number of untested input or output terminals (whichever is larger) for each routing resource determines the minimum number of additional test designs in which the routing resource must be included. The resulting prioritization can be utilized by a router, for example, to first include in test designs those routing resources that must be included in the largest remaining number of test designs. The described prioritization methods can also be used to select one of two or more test designs that should be included in the overall test suite. In each case, the overall number of test designs is reduced.

28 Claims, 10 Drawing Sheets

Start 301
Load unrouted design 302
Identify nets that can be used to test the target routing resources; Set sources for the nets as router source targets 303
Mark target routing resources that are not yet tested for router expansion bonus 304
Set target routing resource as router starting point 305
Route backwards from target routing resource to a router source target 306
Identify a net by source routed to and set a load of the net as router load target 307
Route forwards from target routing resource to a router load target 308
Mark routing resources used by the net as tested 309
Finish routing design and save design 310
Done 311

METHODS OF PRIORITIZING ROUTING RESOURCES TO GENERATE AND EVALUATE TEST DESIGNS IN PROGRAMMABLE LOGIC DEVICES

FIELD OF THE INVENTION

The invention relates to Programmable Logic Devices (PLDs). More particularly, the invention relates to methods of prioritizing PLD routing resources to generate test suites that include minimal numbers of test designs.

BACKGROUND OF THE INVENTION

Programmable logic devices (PLDs) are a well-known type of integrated circuit that can be programmed to perform specified logic functions. FIG. 1 is a simplified illustration of one type of PLD, the Field Programmable Gate Array (FPGA). An FPGA typically includes an array of configurable logic blocks (LBs 101*a*-101*i*) and programmable input/output blocks (I/Os 102*a*-102*d*). The LBs and I/O blocks are interconnected by a programmable interconnection array that includes a large number of interconnect lines 103 interconnected by programmable interconnect points (PIPs 104, shown as small circles in FIG. 1). PIPs are often coupled into groups (e.g., group 105) that implement multiplexer circuits selecting one of several interconnect lines to provide a signal to a destination interconnect line or logic block. Some FPGAs also include additional logic blocks with special purposes (not shown), e.g., DLLs, RAM, and so forth.

The interconnection array, LBs, I/O blocks, and other logic blocks are typically programmed by loading a stream of configuration data into internal configuration memory cells that define how the interconnection array and logic blocks are configured. The configuration data can be read from memory (e.g., from an external PROM) or written into the FPGA by an external device. The collective states of the individual memory cells then determine the function of the FPGA.

FIG. 2 is a simplified illustration of another type of PLD called the Complex Programmable Logic Device, or CPLD. A CPLD includes two or more logic blocks (LBs 201*a*-201*h*) connected together and to input/output blocks (I/Os 202*a*-202*f*) by a programmable interconnection array (203). Each logic block of the CPLD includes a two-level AND/OR structure similar to those used in Programmable Logic Arrays (PLAs) and Programmable Array Logic (PAL) devices. The interconnection array includes many multiplexer circuits 205, each including several PIPs 204. In each multiplexer circuit 205, only one PIP 204 is enabled. The enabled PIP selects one of the many input signals provided to the interconnection array, and the selected input signal is provided as the output signal from the multiplexer circuit 205.

In some CPLDs, configuration data is stored on-chip in non-volatile memory. In other CPLDs, configuration data is stored on-chip in non-volatile memory, then downloaded to volatile memory as part of an initial configuration sequence.

For all of these programmable logic devices (PLDs), the functionality of the device is controlled by data bits provided to the device for that purpose. The data bits can be stored in volatile memory (e.g., static RAM cells, as in FPGAs and some CPLDs), in non-volatile memory (e.g., FLASH memory, as in some CPLDs), or in any other type of memory cell.

Testing a large PLD can be a time-consuming process. A user design can utilize any of what can be millions of programmable elements on the PLD. Therefore, preferably every element on each PLD is thoroughly tested, including every programmable logic element and every interconnect line. This goal can be difficult to achieve using known technology, particularly the testing of all routing resources (e.g., interconnect lines, PIPs, routing multiplexers, and so forth) in a PLD.

Known routing software is designed to route nets between net terminals, typically from a known source terminal to a known load terminal. Known routing software is not designed to route through specific routing resources. Therefore, targeting a specific routing resource to be included in a test design can be very difficult.

According to known methods, to test routing resources in a PLD a set of test designs is created that collectively utilize all of the routing resources in the PLD (or as close to all as can reasonably be accomplished). The routing resources are included in the test designs in such a manner that if any routing resource in the PLD does not work correctly, then one of the test designs will fail to function properly and a testing failure will be reported.

Historically, a modified general product router has been used to test as many routing resources as possible in each design. To accomplish this goal, information is maintained in a database as to whether or not a routing resource has already been tested, and the router uses this information to help its expansion algorithm find untested routing resources. Most routers use general wave front expansion, which routes a single net or source/load pair at a time, and generally from the source to the load of the net. Resource costs are used to help guide the router in the right direction via the expansion algorithm used by the router. When previously untested resources are included in the design, a bonus is given for using these resources. When previously tested resources are included, a penalty is assessed.

However, this known method has its drawbacks. In particular, the process tends to build up penalty walls between net sources and untested resources, because everything close to the source is tested quickly.

Enhancements have been made to the process in an attempt to overcome this drawback. One such enhancement is to reduce the cost of a routing path's resources when an untested resource is found late in the process after penalty walls have been built. The rationale behind this approach is that if an untested resource is found late in the process, then there may be other untested resources in the same area. By reducing the cost of routing to the area, the probability of picking up more untested resources is increased.

When these known methods are used, untested routing resources are picked up quickly in the early stages of the routing process. However, the number of untested resources picked up by future passes drops off dramatically. In addition, the last few untested resources are frequently never picked up at all, because the expansion algorithm never locates them. These resources are often referred to as "hard to test" resources. To include these hard to test resources in test designs, test engineers frequently have to route them manually. This process can be difficult and time consuming. Additionally, the use of known methods can result in a set of test designs including a few designs that test a large number of resources, and a number of designs each of which tests very few additional resources.

In general, it is desirable to provide more efficient methods of generating test designs for PLDs that result in a smaller overall number of test designs.

SUMMARY OF THE INVENTION

The invention provides methods of prioritizing untested routing resources in PLDs that can be used, for example, to generate test suites including a minimal number of test designs. The untested routing resources are prioritized (e.g., placed into an ordered list) based on a number of untested input or output terminals for each untested resource. Only one input terminal and a limited number of output terminals for each routing resource can be included in each test design. Thus, the number of untested input or output terminals (whichever is larger) for each routing resource determines the minimum number of additional test designs in which the routing resource must be included. Therefore, it is advantageous to give a higher priority to including in test designs those routing resources having a larger number of input or output terminals that still remain to be tested.

Therefore, the resulting prioritization can be utilized by a router, for example, to first include in test designs those routing resources that must be included in the largest remaining number of test designs. Hence, the overall number of test designs is reduced.

The prioritization methods of the present invention can be used in conjunction with test design generation software that directly targets specified routing resources in a PLD, e.g., routing resources that need to be tested. Test designs are produced that implement observable nets using the targeted routing resources. To accomplish this goal, a PLD router is used to route from a target routing resource backwards through the routing fabric of the PLD to the source of an observable net. The net is identified based on the source, and loads of the net are identified as router load targets. The router is then used to route from the target routing resource forwards to one of the loads on the net. This process can be repeated for a list of target routing resources to provide a test design that tests as many of the target routing resources as possible. Additional test designs can be created to test remaining target routing resources not included in previously-created designs. In other embodiments, the router routes first forwards, then backwards.

The prioritization methods of the invention can also be used to select one of two or more test designs that should be included in an overall test suite. Two or more test designs can be created from the same unrouted or partially routed design. The prioritization methods of the present invention can be used when routing some, all, or none of these designs. For each of the newly created test designs, each newly tested resource (i.e., each previously untested resource included in the new design) is assigned a score based on the number of input or output terminals that remain untested. For each design, the total of the scores for the previously untested resources in the design determines the total score for that design. Thus, a test design utilizing resources that must be included in a large number of test designs is given a high score. The test design having the highest total score is included in the test suite, while the other designs are discarded.

BRIEF DESCRIPTION OF THE DRAWINGS

The present invention is illustrated by way of example, and not by way of limitation, in the following figures.

DETAILED DESCRIPTION OF THE DRAWINGS

The present invention is believed to be applicable to a variety of programmable logic devices (PLDs). The present invention has been found to be particularly applicable and beneficial for field programmable gate arrays (FPGAs). However, the present invention is not so limited. Further, numerous specific details are set forth herein to provide a more thorough understanding of the present invention. It will be apparent to one skilled in the art that the present invention can be practiced without these specific details.

As previously described, a known method of generating test designs for PLD routing resources includes starting with a list of nets from an unrouted design, and implementing the nets while preferentially targeting previously unused routing resources. In contrast, the method illustrated in FIG. 3 utilizes another approach, that of starting from a target routing resource, then routing backwards from the target routing resource to a source and forwards from the target routing resource to a load. Thus, routing resources not yet included in a test design are directly addressed by the router. Directly addressing the untested routing resources generally eliminates the previously-described phenomenon of "hard to test" routing resources.

Figure 1:
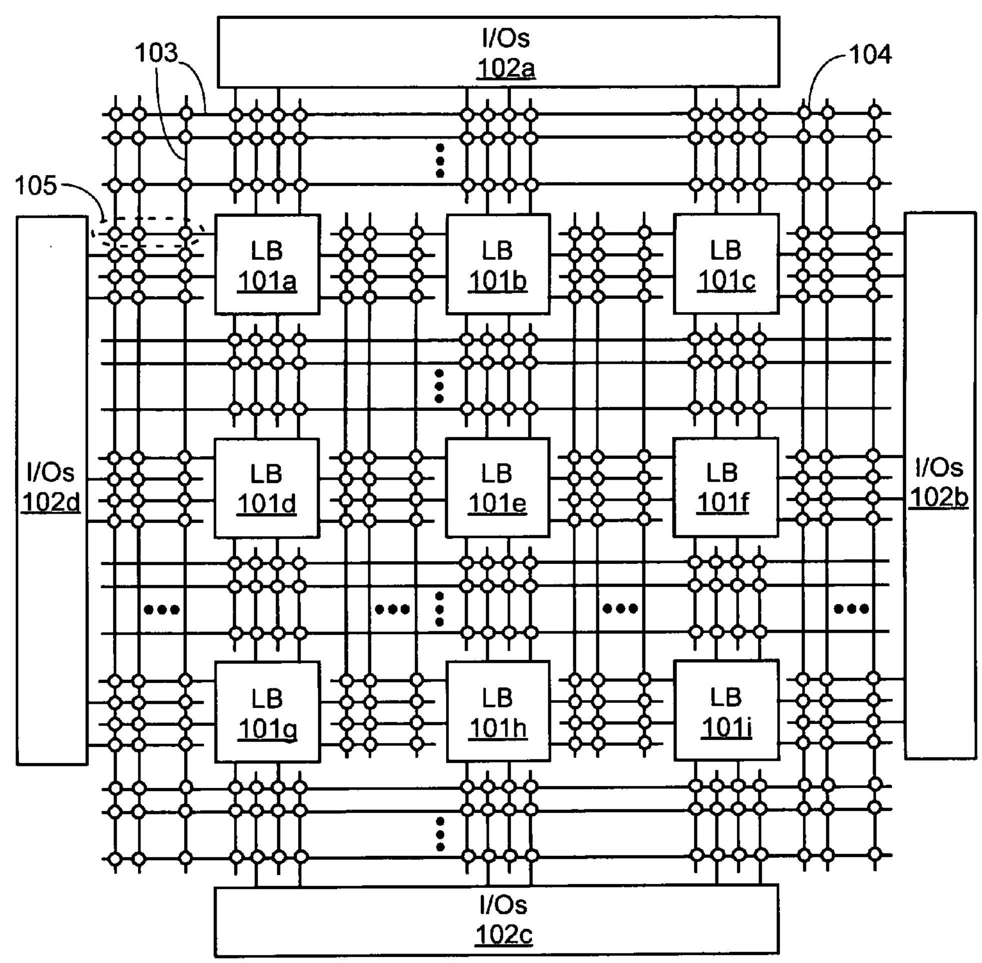
FIG. 1 is an architectural representation of a field programmable gate array (FPGA) type of PLD.
Figure 2:
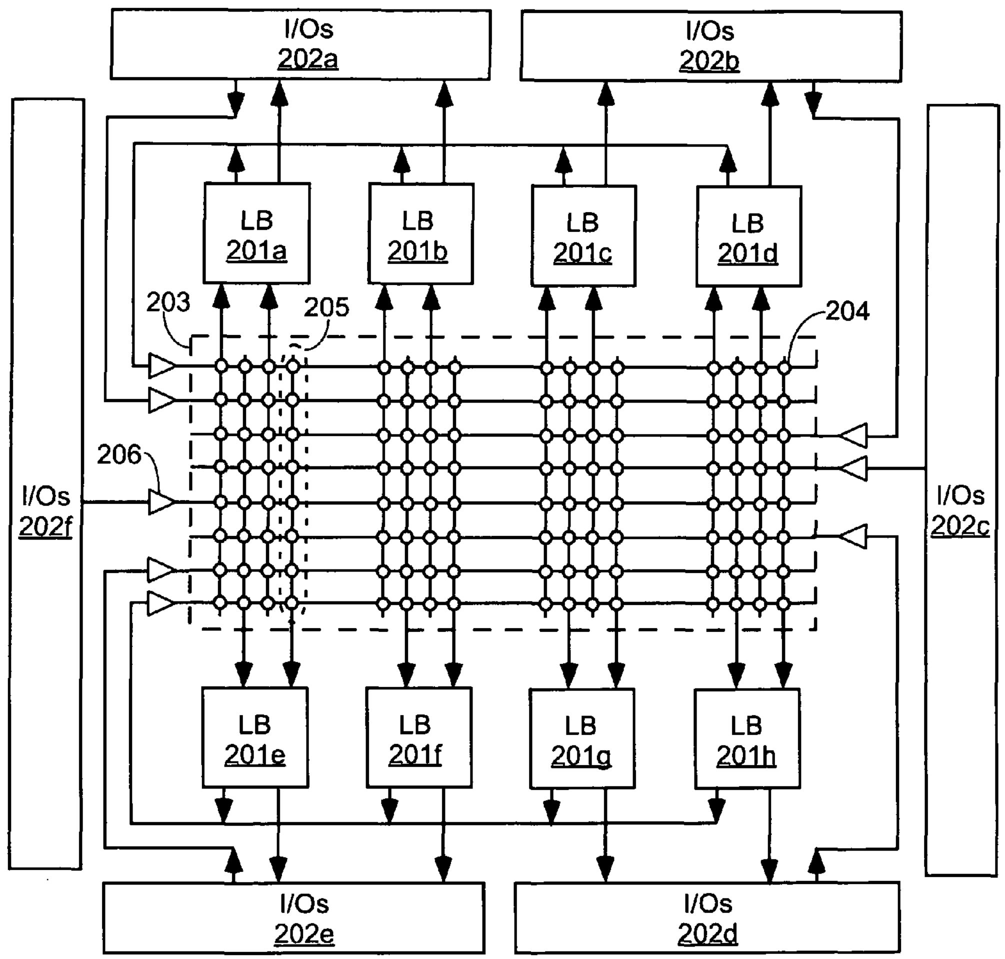
FIG. 2 is an architectural representation of a complex programmable logic device (CPLD) type of PLD.
Figure 3:
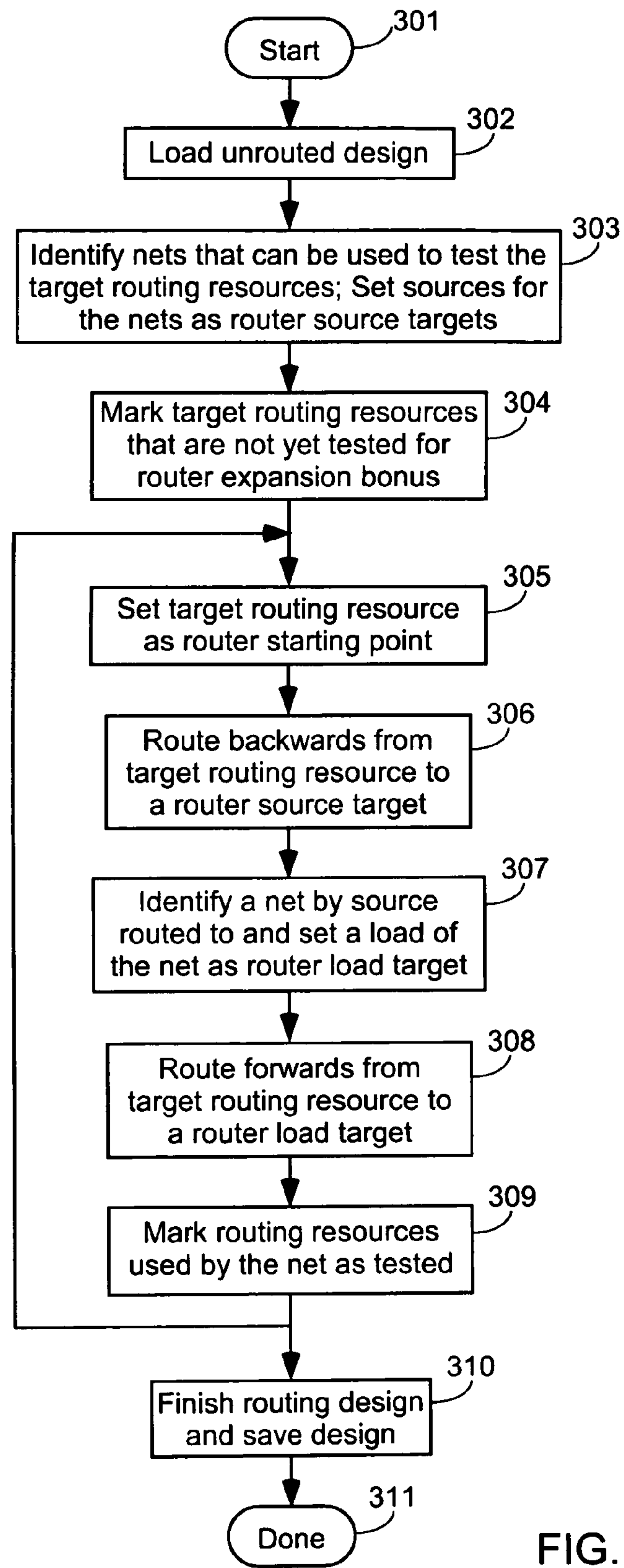
FIG. 3 illustrates the steps of a first method of generating a test design for a PLD.

FIG. 3 illustrates the steps of one method of generating test designs for a PLD. The term "generating a test design" is used in this context to mean starting with an existing but unrouted or partially routed design, and adding routing information to the design to provide a fully routed design that can be used for testing purposes. Start step 301 provides a starting point for the process. In step 302, an unrouted design is loaded (e.g., provided to or accessed by the router software). The unrouted design is a description of the test design that includes implementations and placements of the programmable logic portions of the design, but in which the nets interconnecting the logic portions are not yet connected via the routing resources of the PLD.

In step 303, the nets in the unrouted design that can be used to test the target routing resources are identified. The identified nets can include all nets in the unrouted design that are observable by the tester. For example, the identified nets can include all nets in which a flaw (e.g., a manufacturing defect) will cause the tester to report a testing failure when a "marching one" test is applied to a test input port. These nets can include, for example, nets in the data flow of test data through the design, while omitting clock nets, reset nets, and nets that carry control signals for the design. Also in step 303, the sources of the identified nets are set as source targets for the router ("router source targets").

In optional step 304, target routing resources in the PLD (e.g., routing resources to be tested that are not yet included in a test design) are marked to receive a router expansion bonus. These resources will receive preferential treatment by the router. When routing backwards and forwards from the target routing resource, the router will attempt to use these marked resources rather than other routing resources that are already included in other test designs. This bonus should be used carefully, as applying too large a bonus can create unroutable designs. An undesirably large bonus can also cause nets to be routed inefficiently, i.e., using large numbers of routing resources. This can cause the delay of the net to exceed a maximum allowable delay. An appropriate magnitude for the bonus can be determined for each router and PLD by straightforward experimentation.

In step 305, one of the target routing resources is set as the starting point for the router. Note that some routing resources in a PLD can be considered to be "locked" by a net. Locked routing resources are routing resources that can only be used by one specific net in the test design. Therefore, the router has no choice as to which net is routed through a locked resource. In some embodiments, the nets associated with the locked resources are routed separately, and steps 305-308 are not applied to these resources.

Figure 8:
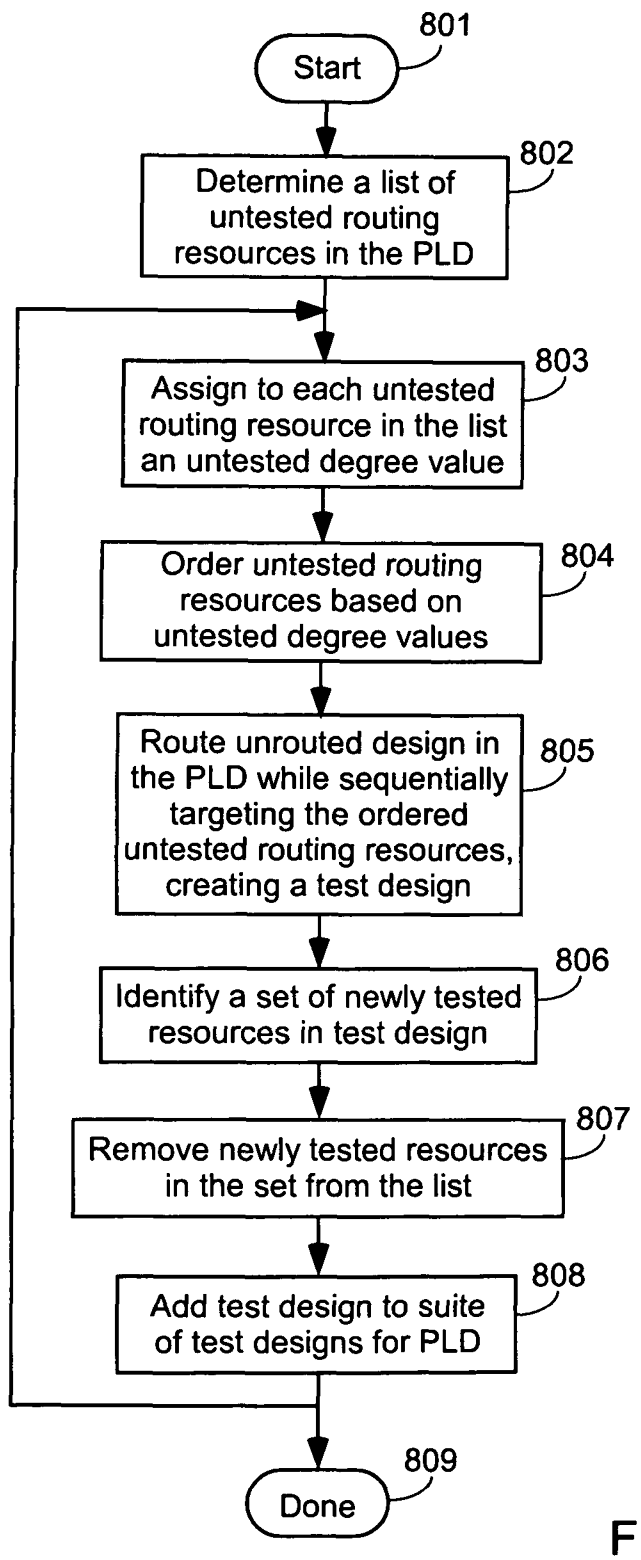
FIG. 8 illustrates the steps of a method of prioritizing routing resources in a PLD to generate a test design.

The order in which the target routing resources are addressed by the router can have a significant effect on the final number of test designs required to test all of the remaining untested routing resources (e.g., the total number of test designs in a test suite). For example, preferentially routing the routing resources that require the largest number of test designs (e.g., the routing resources having the largest numbers of input and output terminals) can reduce the total number of test designs. An exemplary method of prioritizing the target routing resources for routing is illustrated in FIG. 8 and is described below in conjunction with that figure.

In step 306, the router routes backwards from the target routing resource to one of the router source targets set in step 303. The choice of a router source target determines which net in the design is routed through the target routing resource. The selection of a net from the design to test each target routing resource is made dynamically as part of the routing process. When more than one net is available, the net used to test a target routing resource should not be pre-determined, because the source and load of some of the nets might be too far away to generate a route within requested delay limits.

In step 307, the net associated with the router source target of step 306 is identified, and one or more loads of the net are set as load targets for the router ("router load targets"). In step 308, the router routes forward from the target routing resource to one of the router load targets identified in step 307.

Steps 306-308 can occur sequentially, as shown in FIG. 3, or interactively one with another. For example, in one interactive embodiment, the dynamic selection of a net includes identifying all nets that could be used to test the target routing resource, considering the sources of all of these nets as targets for the router, and allowing the router to route backwards to each of the sources. If none of the routes succeeds then the target routing resource cannot be tested in this test design. If one of the routes succeeds then the net is identified and the router can attempt to route forwards from the target routing resource to the loads of the net.

In step 309, the routing resources used by the net are marked as tested, including the target routing resource. All other routing resources used by the net are also preferably marked as tested. Thus, the method of FIG. 3 will not be unnecessarily applied to these routing resources. Additionally, the used routing resources will no longer be given preferential treatment by the router in later-generated test designs for the PLD. In some embodiments, a list of the targeted routing resources is maintained, and the used routing resources are marked in the list.

At this point, the router is ready to route another of the nets in the design, targeting another of the target routing resources. Thus, steps 305-309 are repeated, in one embodiment until each of the target routing resources has either been successfully routed or has failed to route.

In step 310, any nets left in the design that remain unrouted are routed using any available routing resources, and the design is saved. The method terminates at Done step 311.

Figure 4:
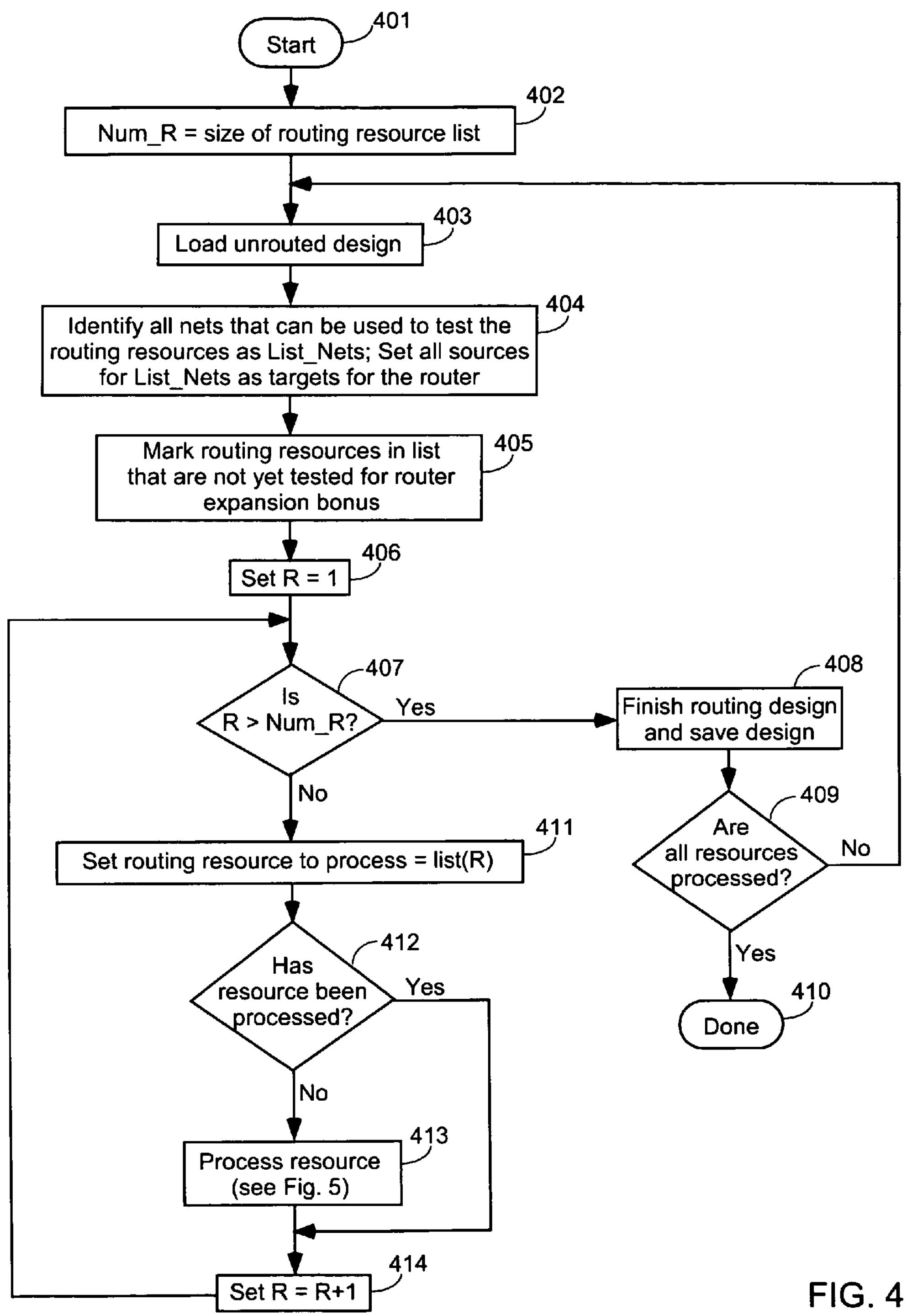
FIG. 4 illustrates the steps of a second method of generating a test design for a PLD.
Figure 5:
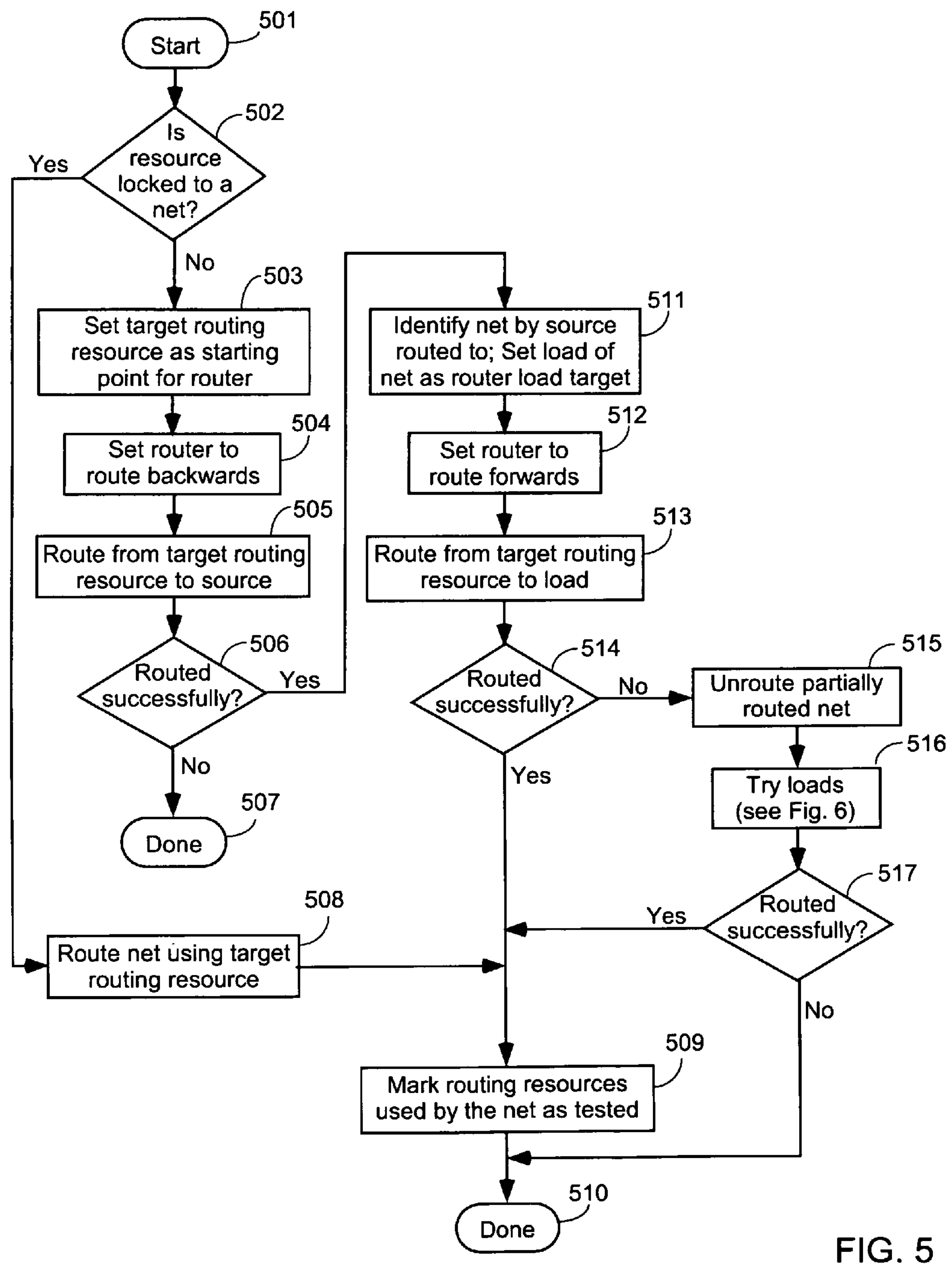
FIG. 5 illustrates one method of processing a target routing resource, e.g., when the method of FIG. 4 is applied.
Figure 6:
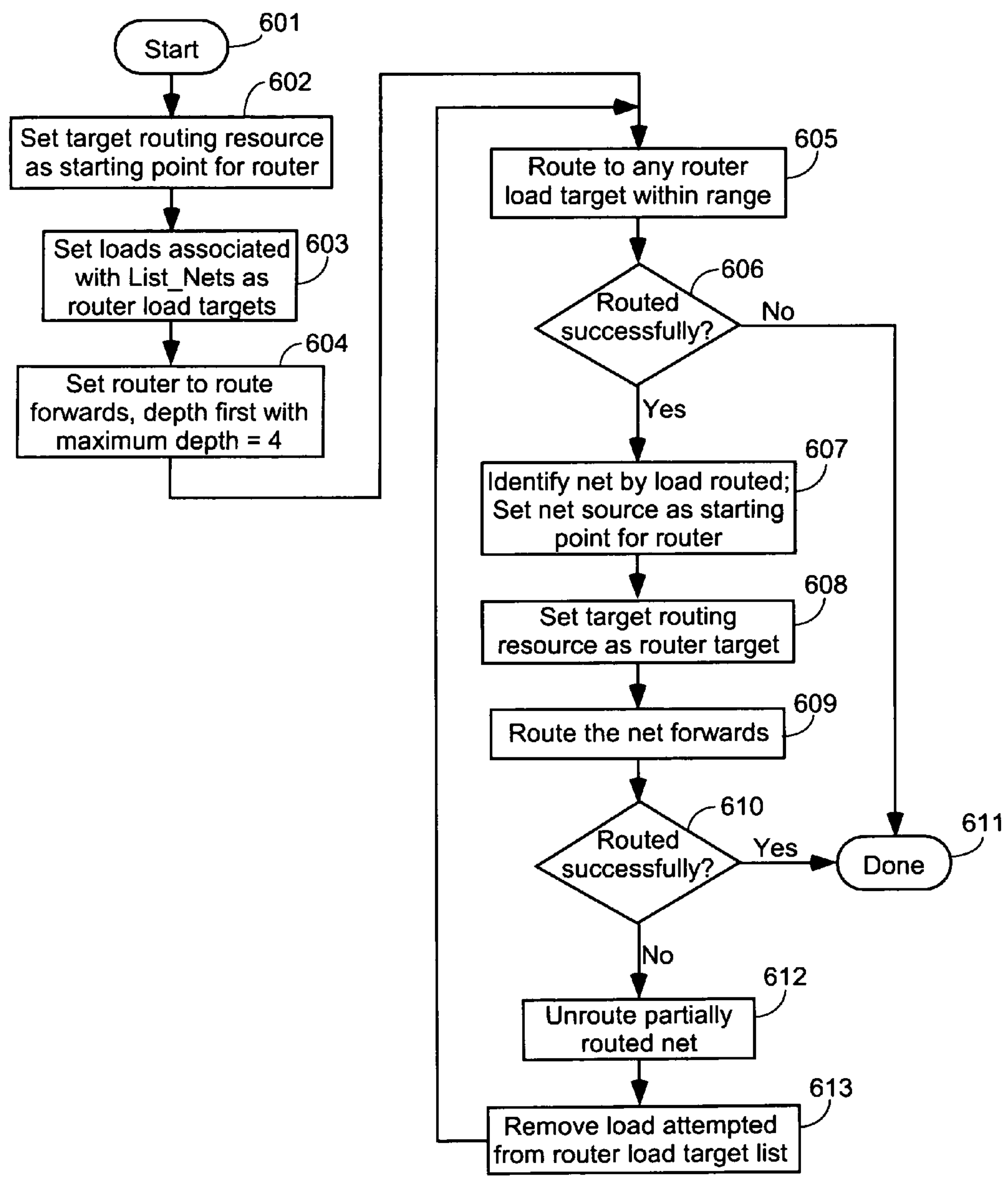
FIG. 6 illustrates one method of routing forwards from a target routing resource to a series of loads on a net, e.g., when the method of FIG. 5 is applied.

In the method of FIG. 3, the router routes from the target routing resource first to sources, then to loads. For some target routing resources, the route from the target routing resource to the load will not be successful, because the loads that the target routing resource can drive are limited. For example, some FPGAs include CLB input multiplexers (the target routing resources) that can drive several loads, but all are located in a limited physical area (e.g., all in the same CLB). However, each CLB input multiplexer can potentially be driven by a relatively large number of different sources. This type of resource is more likely to be picked up by a route that first routes from the target routing resource to the load, then from the target routing resource to the source. Therefore, in some embodiments, if the "first source, then load" route is unsuccessful, a "first load, then source" route is attempted. FIGS. 4-6 illustrate one such embodiment.

FIG. 4 illustrates the steps of a second method of creating test designs for routing resources in a PLD. Start step 401 provides a starting point for the process. In step 402, the variable Num_R is set to the size of a routing resource list for the PLD. The routing resource list is a list of target routing resources for the PLD. In step 403, an unrouted design is loaded.

In step 404, the nets in the unrouted design that can be used to test the target routing resources are identified and placed in a list called List_Nets. Also in step 404, all sources for the nets in List_Nets are set as targets for the router. In optional step 405, the target routing resources in the routing resource list that are not yet tested are marked to receive a router expansion bonus.

In step 406, a variable R is set to "1" (one). In decision step 407, the value of variable R is compared to Num_R, the size of the routing resource list. If R exceeds Num_R, the route is complete for all target routing resources, and the method continues at step 408. In step 408, any nets left in the design that remain unrouted are routed using any available routing resources, and the design is saved. If all target routing resources have been processed (decision step 409), the method terminates at Done step 410. If not, another unrouted design is loaded, and the method continues at step 403.

In step 407, if R does not exceed Num_R, at least one target routing resource remains on the routing resource list, and the method continues at step 411. In step 411, the "routing resource to process" is set to list(R), i.e., the next target routing resource on the list. If the resource has not already been processed (decision step 412), the resource is processed (step 413). Details of the resource processing for one embodiment are shown in FIG. 5. If the resource was already processed (decision step 412), the method proceeds directly to step 414, where the variable R is incremented to point to the next target routing resource on the routing resource list.

FIG. 5 shows how each target routing resource is processed in step 413 of FIG. 4, according to one embodiment.

Start step 501 provides a starting point for the method of FIG. 5.

In decision step 502, if the target routing resource is locked to just one net (i.e., is a "locked resource"), the net is routed using the target routing resource (step 508), and the method continues at step 509. If the target routing resource is not a locked resource (step 502), the target routing resource is set as a starting point for the router (step 503). The router is then set to route backwards (step 504) and routes from the target routing resource backwards to one of the sources set as router targets in step 404 (see FIG. 4).

In decision step 506, if the route is not successful (e.g., the router cannot route from the target routing resource to any of the available sources), the resource processing is complete, and the flow returns to FIG. 4 via Done step 507. If the route is successful (e.g., the router successfully routes from the target routing resource to one of the available sources), the net associated with the source routed to is identified and the load of the net is set as the router load target (step 511).

In step 512, the router is set to route forwards, and in step 513 the router routes the net from the target routing resource to the load. If the route is successful, the method continues at step 509, where the routing resources used by the routed net are marked as tested (e.g., in the routing resource list), and the method is complete (Done step 510). If the route is not successful (step 514), the partially routed net is unrouted (step 515), and the router attempts to reroute the net using other loads of the net ("try loads" step 516). Details of the "try loads" process for one embodiment are shown in FIG. 6.

If the router successfully routes the net using one of the other loads (decision step 517), the method continues at step 509. If the router is not successful in routing the net (step 517), the method terminates (Done step 510).

FIG. 6 shows how the router attempts to route the net using additional loads in step 516 of FIG. 5, according to one embodiment. Start step 601 provides a starting point for the method of FIG. 6. In step 602, the target routing resource is set as the starting point for the router. In step 603, the loads associated with the nets in List_Nets (see step 404 of FIG. 4) are set as router load targets. In step 604, the router is set to route forwards. In the pictured embodiment, the router is also set to perform a depth first route with a maximum depth of four routing resources. In other words, only loads within four routing resources of the target routing resource will be routed to. Depth first routes are well known to those of skill in the PLD routing arts. In step 605, the router attempts to route to any router load target within the specified range.

If the attempt to route from the target routing resource to a load is not successful (decision step 606), the target routing resource cannot be used in the present test design, and the method terminates (Done step 611). If the attempt is successful (step 606), the net associated with the successful load is identified and the source for the net is set as the starting point for the router (step 607). The target routing resource is set as the router target (step 608), and the router attempts to route forward from the source to the target routing resource. If the attempt is successful (decision step 610), the net is routed and the method terminates (Done step 611). If the attempt is not successful (step 610), the partially routed net is unrouted (step 612), and the load just attempted is removed from the router load target list. The method continues at step 605, and the router attempts to route the net using another load.

Note that in the embodiment of FIG. 6, the router routes forward from the source to the target routing resource. In other embodiments (not shown), the router routes backwards from the target routing resource to the source of the net.

Figure 7:
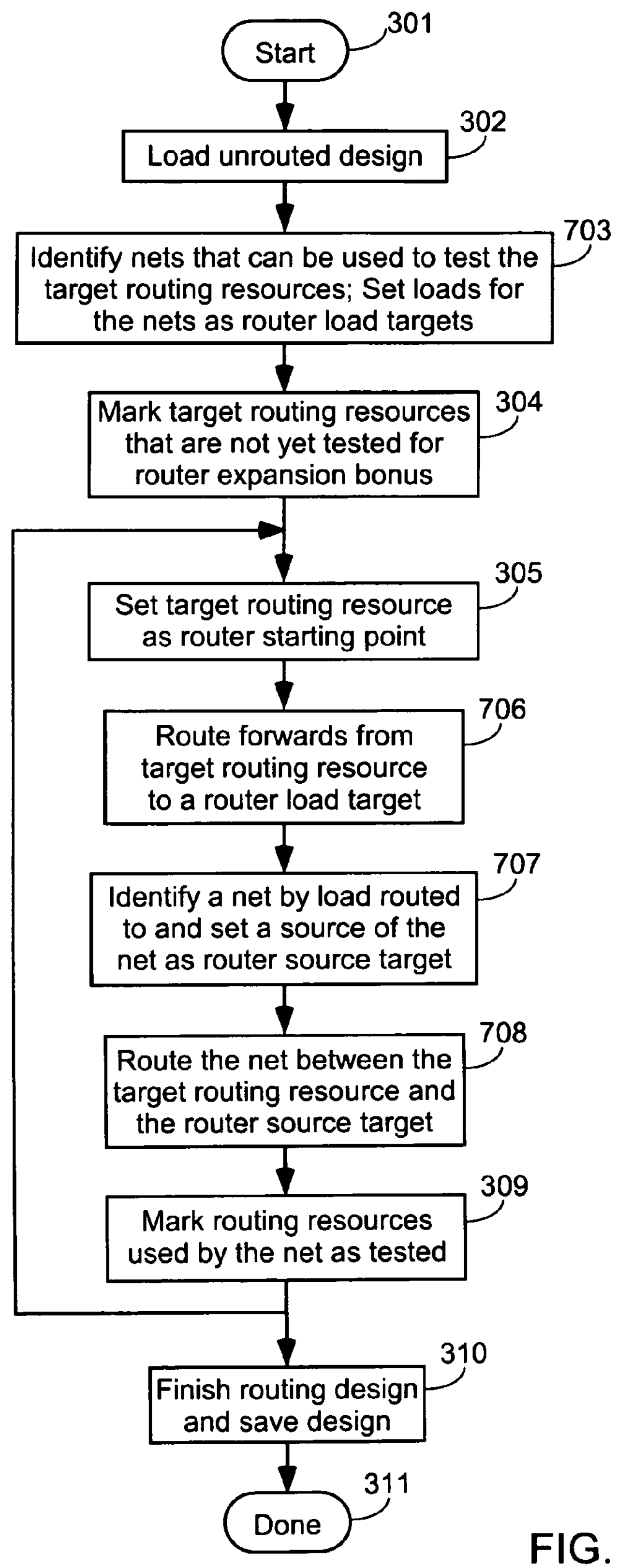
FIG. 7 illustrates the steps of a third method of generating a test design for a PLD.

In the method of FIG. 3, the router routes from the target routing resource first to sources, then to loads. In the method of FIGS. 4-6, the "first source, then load" approach is first attempted. However, if this route fails, the router attempts to route to the loads first, and then to the sources. FIG. 7 illustrates another embodiment that utilizes the "first load, then source" approach.

The method of FIG. 7 is similar to the method of FIG. 3. Therefore, similarly numbered steps are similar to corresponding steps in FIG. 3. The following steps differ between the two figures. In step 703, after identifying the nets that can be used to test the target routing resources, the loads for the nets are set as router load targets. In step 706, the router routes forward from the target routing resource to a router load target, instead of routing backwards from a routing resource to the source as in step 306 (see FIG. 3). In step 707, the net is identified by the load routed to, and a source of the net is set as the router source target. In step 708, the router routes the net between the target routing resource and the router source target. In some embodiments, the router routes backwards from the target routing resource to the router source target. In other embodiments, the router routes forwards from the router source target to the target routing resource.

FIG. 8 illustrates the steps of a method of prioritizing routing resources in a PLD to generate a test design. This method can be used, for example, in the method of FIG. 3 to determine the order in which the target routing resources are addressed by the router.

The rationale behind the illustrated method is that some routing resources have larger numbers of input terminals and/or output terminals than others. For example, long interconnect lines (long lines) in a PLD sometimes have only a few input terminals (i.e., connections allowing a signal to get onto the long line), while including hundreds of output terminals (i.e., connections allowing a signal to exit the long line). Each of these terminals must be tested, and each test design can utilize at most one input terminal and a limited number of output terminals. In fact, in many test designs only one output terminal is used per routing resource. (e.g., each net has only one driver and one load). Therefore, to provide adequate testing such a long line must be included in a very large number of test designs. The long line might in fact determine the total number of test designs required to test the PLD. Therefore, it is advantageous to preferentially include such a long line in every (or almost every) test pattern until each input and output terminal of the long line has been tested.

Start step 801 provides a starting point for the method of FIG. 8. In step 802, a list of untested routing resources in the PLD is determined. Initially, the list can be generated, for example, from a computer file that lists all interconnect resources in the PLD. After one or more test designs have been generated and added to the test suite for the PLD, the list can be derived from a previous list by removing all routing resources that have been included in at least one test design since the creation of the previous list. In some embodiments, the routing resources are interconnect lines coupled to programmable interconnect points (PIPs) of the PLD.

In step 803, a value is assigned to each untested routing resource in the list. This value is referred to herein as the "untested degree value" or the "untested degree number". The untested degree value of a routing resource is the larger of N or M, where N is the number of input terminals for the resource that remain untested, and M is the number of output terminals for the resource that remain untested. Note that, in general, the larger the untested degree value, the larger the number of additional test designs in which the resource must be included to test all of the terminals.

In step 804, the untested routing resources in the list are ordered based on the untested degree values of the resources. For example, a first resource in the ordered list can be the untested routing resource having the highest untested degree value, while a last resource in the ordered list can be the untested routing resource having the lowest untested degree value.

In step 805, an unrouted design is routed in the PLD while sequentially targeting the ordered untested routing resources in the list. This step produces a first test design. For example, the design can be routed by repeating performing steps 305-309 of FIG. 3. The target routing resource for the first routing "pass" is the untested routing resource having the highest untested degree value.

Subsequent routing resources are targeted based on their positions in the ordered list produced in step 804.

In step 806, the test design produced in step 805 is evaluated to identify a set of routing resources that were previously untested, but are included in the new test design. These resources are referred to herein as "newly tested resources". In step 807, the newly tested resources are removed from the list of untested routing resources in the PLD In step 808, the test design is added to a suite of test designs for the PLD. In some embodiments, step 808 is performed prior to step 806 or step 807. In some embodiments, the new test design is not added to the suite of test designs until after an evaluation of the test design is performed. In some embodiments, two or more test designs utilizing at least partially different routing resources are created and each test design is assigned a score. The score for each design is based on a total untested degree value for the untested routing resources in the design. (Two such embodiments are described below, in conjunction with FIGS. 9 and 10.) Only the design having the highest score is included in the test suite.

Steps 803-808 can now be repeated as desired to generate additional test designs. Each new test design should reduce the number of untested routing resources in the list. Ideally, steps 803-808 are repeated until the list of untested routing resources is empty, and the process is complete (step 809).

Figure 9:
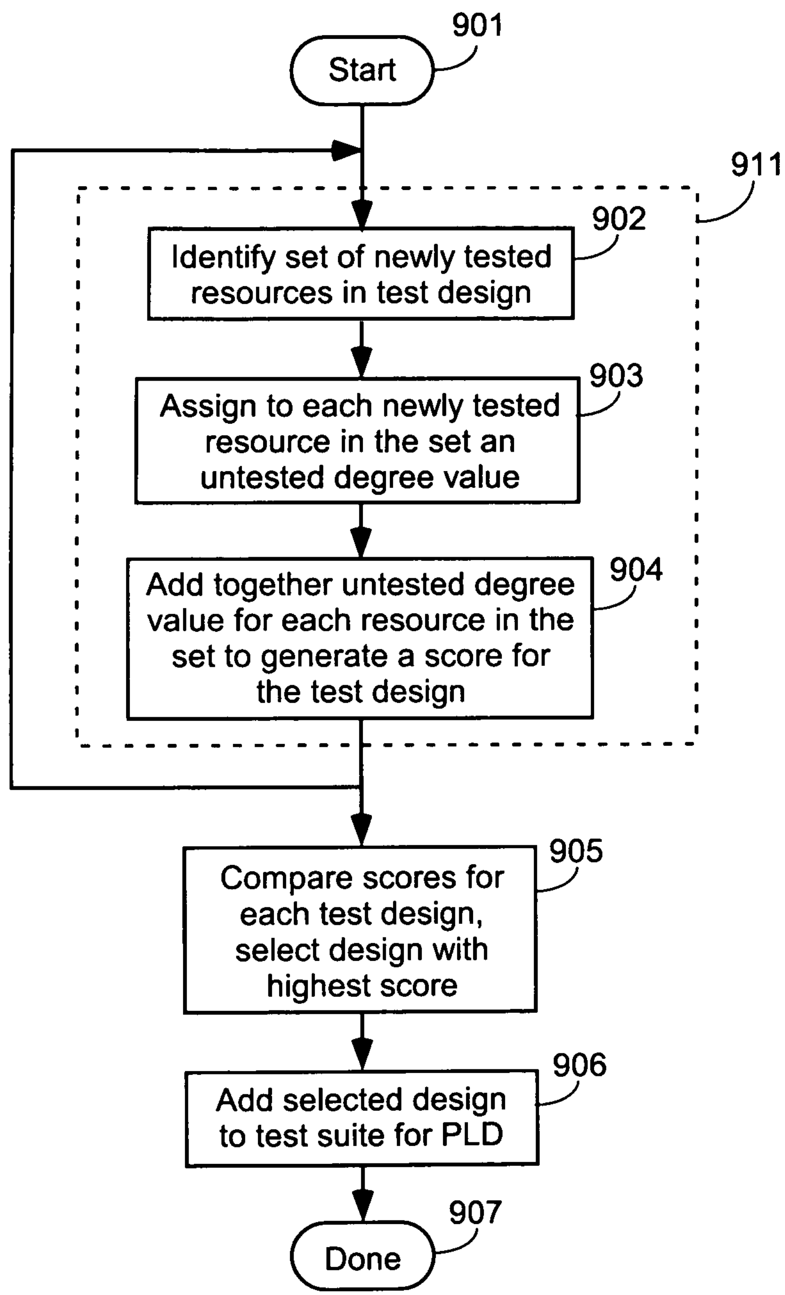
FIG. 9 illustrates the steps of a first method of comparing two or more test designs for a PLD.
Figure 10:
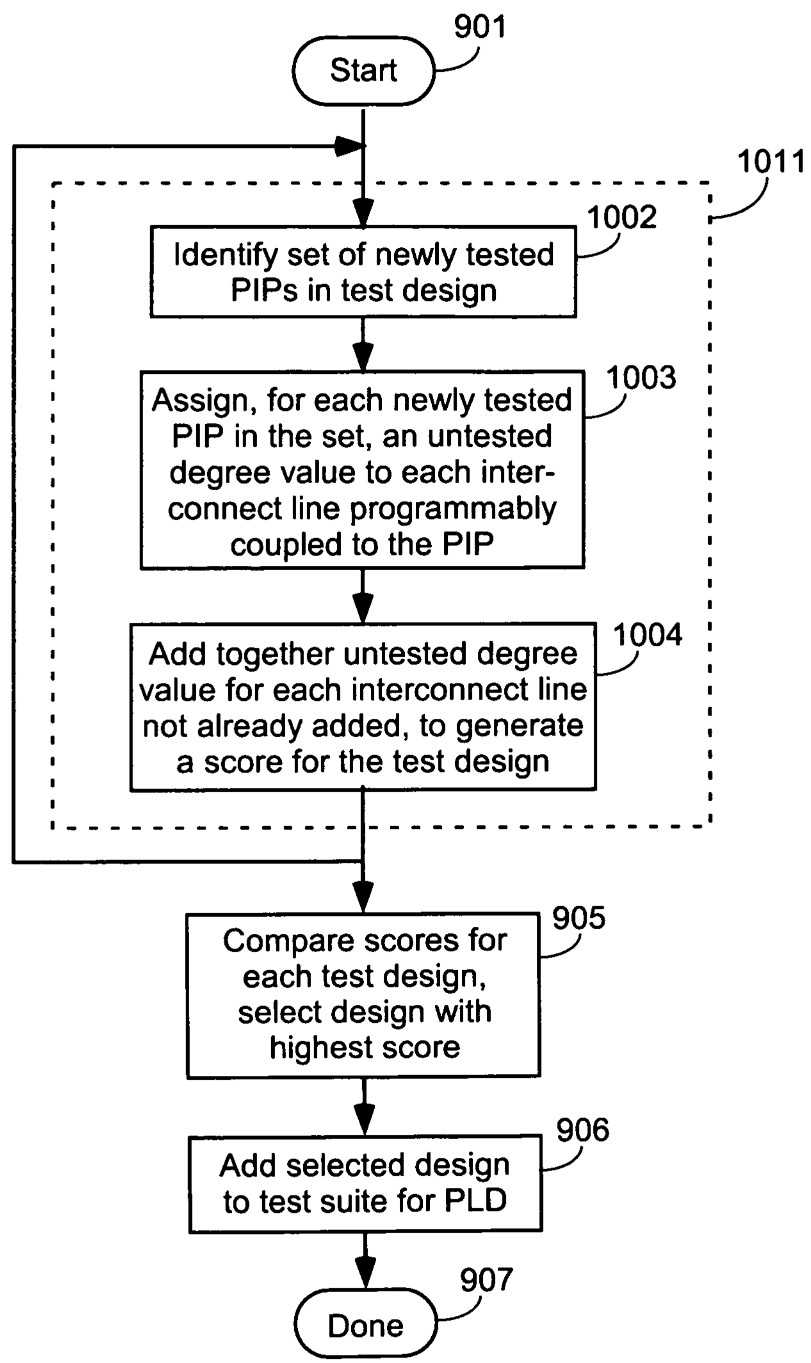
FIG. 10 illustrates the steps of a second method of comparing two or more test designs for a PLD.

In the methods illustrated in FIGS. 9 and 10, untested degree values are used to "score" two or more test designs. The test designs are each routed from the same unrouted or partially routed (i.e., at least partially unrouted) design, so the only difference between the test designs is which routing resources are included in the design. A test design that includes a large number of newly tested resources with large untested degree values is given a higher score than a test design including fewer newly tested resources with lower untested degree values. Thus, the scoring favors designs that utilize newly tested resources that must be included in a large number of test designs. In some embodiments, the selected design is added to a suite of test designs for the PLD, and the other design(s) are discarded.

FIG. 9 illustrates the steps of a first method of comparing two or more test designs for a PLD using untested degree values.

Start step 901 provides a starting point for the method of FIG. 9. Steps 902-904 together form a method (911) of scoring a test design. To score the test design, the design is evaluated to identify a set of newly tested resources (step 902). Each newly tested resource in the set is assigned an untested degree value (step 903). In step 904, the untested degree values for each resource in the set are added together. The resulting sum is the score for the test design.

Steps 902-904 can be repeated for additional designs, depending on the number of test designs available for comparison. In some embodiments, the various test designs are routed from the same unrouted (or partially routed) design. However, each test design preferably utilizes an at least partially different subset of the routing resources of the PLD (i.e., at least a portion of each test design is routed differently from the other test designs). Therefore, each test design can have a different score.

In step 905, the scores for each test design are compared, and the design having the highest score is selected. In step 906, the selected design is added to a suite of test designs for the PLD, and the process is complete (step 907).

In some embodiments (not shown), the newly tested resources from the selected design are removed from a list of untested routing resources in the PLD, and another group of test designs is generated based on the revised list. Ideally, the process continues until the list of untested routing resources is empty.

Clearly, the nature of the routing resources included in the test designs varies with the nature of the PLD for which the test suite is being created. FIG. 10 addresses an embodiment of the invention in which the routing resources comprise interconnect lines programmably coupled to programmable interconnect points (PIPs) in the PLD. For example, the steps of FIG. 10 can be applied to prioritizing. PLD long lines, as described above in connection with FIG. 8.

FIG. 10 illustrates the steps of a second method of comparing two or more test designs for a PLD using untested degree values. Several of the steps in FIG. 10 are the same as similarly-numbered steps in FIG. 9. These steps are not again described. However, steps 1002-1004 together form a method (1011) of scoring a test design in a PLD including interconnect lines and PIPs. To score the test design, the design is evaluated to identify a set of newly tested PIPs (step 1002). For each newly tested PIP in the set, an untested degree value is assigned to each interconnect line programmably coupled to the PIP in the test design (step 1003).

In step 1004, the untested degree values for each interconnect line are added together. However, the untested degree value for each interconnect line is included only once in the total sum, even when the interconnect line is coupled to more than one newly tested PIP. The resulting sum is the score for the test design.

The methods of the present invention can be performed in either hardware, software, or any combination thereof, as those terms are currently known in the art. In particular, the present methods can be carried out by software, firmware, or microcode operating on a computer or computers of any type. Additionally, software embodying the present invention can comprise computer instructions in any form (e.g., source code, object code, interpreted code, etc.) stored in any computer-readable medium (e.g., ROM, RAM, magnetic media, punched tape or card, compact disc (CD) in any form, DVD, etc.). Further, such software can also be in the form of a computer data signal embodied in a carrier wave, such as that found within the well-known Web pages transferred among computers connected to the Internet. Accordingly, the present invention is not limited to any particular platform, unless specifically stated otherwise in the present disclosure.

Those having skill in the relevant arts of the invention will now perceive various modifications and additions that can be made as a result of the disclosure herein. For example, the above text describes the methods of the invention in the context of field programmable gate arrays (FPGAs). However, the methods of the invention can also be implemented in other PLDs, e.g., in complex programmable logic devices (CPLDs) and other re-programmable devices.

Accordingly, all such modifications and additions are deemed to be within the scope of the invention, which is to be limited only by the appended claims and their equivalents.

What is claimed is:

1. A method of prioritizing resources in a programmable logic device (PLD) to generate a test design, the test design utilizing routing resources of the PLD, the method comprising:

determining a list of untested routing resources in the PLD;

assigning to each of the untested routing resources in the list an untested degree value, the untested degree value comprising a larger one of a number of untested input terminals and a number of untested output terminals for the resource; and ordering the untested routing resources within the list based on the untested degree value of each untested routing resource; wherein the determining, the assigning, and the ordering are performed by a computer device.

2. The method of claim 1, further comprising:

routing an unrouted design in the PLD while sequentially targeting the ordered untested routing resources in the list, thereby creating a first test design.

3. The method of claim 2, further comprising:

identifying a set of newly tested resources in the first test design previously identified as untested routing resources; and removing the newly tested resources from the list.

4. The method of claim 3, further comprising:

repeating the assigning and ordering steps on the list after the newly tested resources are removed.

5. The method of claim 2, further comprising:

routing the unrouted design in the PLD a second time, thereby creating a second test design having different routing from the first test design;

assigning a first score to the first test design;

assigning a second score to the second test design; and selecting one of the first and second test designs based on which of the first and second test designs has a higher score.

6. The method of claim 5, wherein assigning a first score to the first test design comprises:

identifying a set of newly tested resources in the first test design previously identified as untested routing resources;

assigning to each of the newly tested resources in the set an untested degree number, the untested degree number comprising a larger one of a number of untested input terminals and a number of untested output terminals for the newly tested resource; and adding together the untested degree numbers for each of the newly tested resources in the set to generate the first score.

7. The method of claim 5, wherein the routing resources of the PLD comprise interconnect lines programmably coupled to programmable interconnect points (PIPs), and wherein assigning a first score to the first test design comprises:

identifying a set of newly tested PIPs in the first test design previously identified as untested routing resources;

assigning, for each PIP in the set, an untested degree number for each interconnect line programmably coupled to the PIP within the first test design, the untested degree number comprising a larger one of a number of untested input terminals and a number of untested output terminals for the interconnect line; and generating the first score by adding together the untested degree numbers for each interconnect line for which the untested degree number has not already been added.

8. The method of claim 1, wherein the routing resources of the PLD comprise interconnect lines coupled to programmable interconnect points (PIPs).

9. A non-transitory computer-readable storage medium comprising computer-executable code configured to prioritize resources in a programmable logic device (PLD) to generate a test design, the test design utilizing routing resources of the PLD, the medium comprising:

code configured to determine a list of untested routing resources in the PLD;

code configured to assign to each of the untested routing resources in the list an untested degree value, the untested degree value comprising a larger one of a number of untested input terminals and a number of untested output terminals for the resource; and code configured to order the untested routing resources within the list based on the untested degree values of each untested routing resource.

10. The computer-readable storage medium of claim 9, further comprising:

code configured to route an unrouted design in the PLD while sequentially targeting the ordered untested routing resources in the list, thereby creating the test design.

11. The computer-readable storage medium of claim 10, further comprising:

code configured to identify, after routing the unrouted design, a set of newly tested resources previously identified as untested routing resources; and code configured to remove the newly tested resources from the list.

12. The non-transitory computer-readable storage medium of claim 9, wherein the routing resources of the PLD comprise interconnect lines coupled to programmable interconnect points (PIPs).

13. A computer system configured to prioritize resources in a programmable logic device (PLD) to generate a test design, the test design utilizing routing resources of the PLD, the system comprising:

a computer;

a first module configured to determine a list of untested routing resources in the PLD;

a second module configured to assign to each of the untested routing resources in the list an untested degree value, the untested degree value comprising a larger one of a number of untested input terminals and a number of untested output terminals for the resource; and a third module configured to order the untested routing resources within the list based on the untested degree values of each untested routing resource, wherein the first, second and third modules operate on the computer.

14. The computer system of claim 13, further comprising:

a fourth module configured to route an unrouted design in the PLD while sequentially targeting the ordered untested routing resources in the list, thereby creating the test design, wherein the fourth module operates on the computer.

15. The computer system of claim 14, further comprising:

a fifth module configured to identify, after routing the unrouted design, a set of newly tested resources previously identified as untested routing resources; and a sixth module configured to remove the newly tested resources from the list, wherein the fifth and sixth modules operate on the computer.

16. The computer system of claim 13, wherein the routing resources of the PLD comprise interconnect lines coupled to programmable interconnect points (PIPs).

17. A method of scoring a test design for a programmable logic device (PLD), the test design utilizing routing resources of the PLD, the method comprising:

identifying a set of newly tested resources in the test design previously identified as untested routing resources;

assigning to each of the newly tested resources in the set an untested degree value, the untested degree value comprising a larger one of a number of untested input terminals and a number of untested output terminals for the newly tested resource; and adding together the untested degree values for each of the newly tested resources in the set to generate a score for the test design; wherein the identifying, the assigning, and the adding are performed by a computer device.

18. The method of claim 17, wherein the routing resources of the PLD comprise interconnect lines coupled to programmable interconnect points (PIPs).

19. A non-transitory computer-readable storage medium comprising computer-executable code configured to score a test design for a programmable logic device (PLD), the test design utilizing routing resources of the PLD, the medium comprising:

code configured to identify a set of newly tested resources in the test design previously identified as untested routing resources;

code configured to assign to each of the newly tested resources in the set an untested degree value, the untested degree value comprising a larger one of a number of untested input terminals and a number of untested output terminals for the newly tested resource; and code configured to add together the untested degree values for each of the newly tested resources in the set to generate a score for the test design.

20. The non-transitory computer-readable storage medium of claim 19, wherein the routing resources of the PLD comprise interconnect lines coupled to programmable interconnect points (PIPs).

21. A computer system configured to score a test design for a programmable logic device (PLD), the test design utilizing routing resources of the PLD, the system comprising:

a first module configured to identify a set of newly tested resources in the test design previously identified as untested routing resources;

a second module configured to assign to each of the newly tested resources in the set an untested degree value, the untested degree value comprising a larger one of a number of untested input terminals and a number of untested output terminals for the newly tested resource; and a third module configured to add together the untested degree values for each of the newly tested resources in the set to generate a score for the test design.

22. The computer system of claim 21, wherein the routing resources of the PLD comprise interconnect lines coupled to programmable interconnect points (PIPs).

23. A method of scoring a test design for a programmable logic device (PLD), the test design utilizing routing resources of the PLD, the routing resources comprising interconnect lines programmably coupled to programmable interconnect points (PIPs), the method comprising:

identifying a set of newly tested PIPs in the test design previously identified as untested routing resources;

assigning, for each PIP in the set, an untested degree value for each interconnect line programmably coupled to the PIP within the first test design, the untested degree value comprising a larger one of a number of untested input terminals and a number of untested output terminals for the interconnect line; and generating a score for the test design by adding together the untested degree values for each interconnect line for which the untested degree value has not already been added; wherein the identifying, the assigning, and the generating are performed by a computer device.

24. A non-transitory computer-readable storage medium comprising computer-executable code configured to score a test design for a programmable logic device (PLD), the test design utilizing routing resources of the PLD, the routing resources comprising interconnect lines programmably coupled to programmable interconnect points (PIPs), the medium comprising:

code configured to identify a set of newly tested PIPs in the test design previously identified as untested routing resources;

code configured to assign, for each PIP in the set, an untested degree value for each interconnect line programmably coupled to the PIP within the first test design, the untested degree value comprising a larger one of a number of untested input terminals and a number of untested output terminals for the interconnect line; and code configured to generate a score for the test design by adding together the untested degree values for each interconnect line for which the untested degree value has not already been added.

25. A computer system configured to score a test design for a programmable logic device (PLD), the test design utilizing routing resources of the PLD, the routing resources comprising interconnect lines programmably coupled to programmable interconnect points (PIPs), the system comprising:

a first module configured to identify a set of newly tested PIPs in the test design previously identified as untested routing resources;

a second module configured to assign, for each PIP in the set, an untested degree value for each interconnect line programmably coupled to the PIP within the first test design, the untested degree value comprising a larger one of a number of untested input terminals and a number of untested output terminals for the interconnect line; and a third module configured to generate a score for the test design by adding together the untested degree values for each interconnect line for which the untested degree value has not already been added.

26. A method of comparing first and second test designs for a programmable logic device (PLD), the first and second test designs each being routed from the same at least partially unrouted design, the first and second test designs each utilizing an at least partially different subset of the routing resources of the PLD, the method comprising:

assigning a first score to the first test design;

assigning a second score to the second test design;

selecting one of the first and second test designs based on which of the first and second test designs has a higher score; and adding the selected test design to a test suite for the PLD, wherein assigning the first score to the first test design and assigning the second score to the second design each comprise:

identifying a set of newly tested resources in the test design previously identified as untested routing resources;

assigning to each of the newly tested resources in the set an untested degree value, the untested degree value comprising a larger one of a number of untested input terminals and a number of untested output terminals for the newly tested resource; and adding together the untested degree values for each of the newly tested resources in the set to generate a score for the test design wherein the assigning the first score, the assigning the second score, the selecting, and the adding are performed by a computer device.

27. The method of claim 26, wherein the routing resources of the PLD comprise interconnect lines coupled to programmable interconnect points (PIPs).

28. A method of comparing first and second test designs for a programmable logic device (PLD), the first and second test designs each being routed from the same at least partially unrouted design, the first and second test designs each utilizing an at least partially different subset of the routing resources of the PLD, the routing resources comprising interconnect lines programmably coupled to programmable interconnect points (PIPs), the method comprising:

assigning a first score to the first test design;

assigning a second score to the second test design;

selecting one of the first and second test designs based on which of the first and second test designs has a higher score; and adding the selected test design to a test suite for the PLD, wherein assigning the first score to the first test design and assigning the second score to the second design each comprise:

identifying a set of newly tested PIPs in the test design previously identified as untested routing resources;

assigning, for each PIP in the set, an untested degree value for each interconnect line programmably coupled to the PIP within the first test design, the untested degree value comprising a larger one of a number of untested input terminals and a number of untested output terminals for the interconnect line; and generating a score for the test design by adding together the untested degree values for each interconnect line for which the untested degree value has not already been added; wherein the assigning the first score, the assigning the second score, the selecting, and the adding are performed by a computer device.

* * * * *